United States Patent

Wang et al.

[11] Patent Number: 6,099,662
[45] Date of Patent: Aug. 8, 2000

[54] PROCESS FOR CLEANING A SEMICONDUCTOR SUBSTRATE AFTER CHEMICAL-MECHANICAL POLISHING

[75] Inventors: Ying-Lang Wang, Taichung; Jowei Dun, Hsin-Chu; Ken-Shen Chou, Hsin-Chu; Yu-Ku Lin, Hsin-Chu, all of Taiwan

[73] Assignee: Taiwan Semiconductor Manufacturing Company, Hsin-Chu, Taiwan

[21] Appl. No.: 09/248,726

[22] Filed: Feb. 11, 1999

[51] Int. Cl.⁷ .............................. B08B 3/00; H01L 21/00
[52] U.S. Cl. ................................ 134/26; 134/28; 134/29; 438/692; 438/748
[58] Field of Search .............................. 134/1.3, 2, 3, 26, 134/28, 29; 216/38, 88, 89, 91, 92; 438/691, 692, 693, 745, 747, 748, 749; 252/79.2, 79.3, 79.4, 79.5

[56] References Cited

U.S. PATENT DOCUMENTS

| | | | |
|---|---|---|---|
| 4,871,417 | 10/1989 | Nishizawa et al. | 438/748 |
| 5,078,801 | 1/1992 | Malik | 134/29 |
| 5,489,557 | 2/1996 | Jolley | 438/748 X |
| 5,597,443 | 1/1997 | Hempel | 156/636.1 |
| 5,632,667 | 5/1997 | Earl et al. | 451/41 |
| 5,679,169 | 10/1997 | Gonzales et al. | 134/1.3 |
| 5,704,987 | 1/1998 | Huynh et al. | 134/6 |
| 5,976,983 | 11/1999 | Miyazaki et al. | 438/745 X |

*Primary Examiner*—William Powell
*Attorney, Agent, or Firm*—George O. Saile; Stephen B. Ackerman

[57] ABSTRACT

An improved method for removing residual slurry particles and metallic residues from the surface of a semiconductor substrate after chemical-mechanical polishing has been developed. The cleaning method involves sequential spray cleaning solutions of $NH_4OH$ and $H_2O$, $NH_4OH$, $H_2O_2$ and $H_2O$, HF and $H_2O$, and HCl, $H_2O_2$ and $H_2O$. The cleaning sequence is: 1. A pre-soak in a spray solution of $NH_4OH$ and $H_2O$; 2. Spray cleaning in a solution of $NH_4OH$, $H_2O_2$ and $H_2O$; 3. Spray cleaning in a dilute solution of HF and $H_2O$; 4. Spray rinsing in DI-water. It is important that slurry particulates first be removed by $NH_4OH$, $H_2O_2$ and $H_2O$, followed by spray cleaning in a dilute solution of HF and $H_2O$ to remove metallic residues. The spray cleaning method is superior to brush cleaning methods for both oxide-CMP and tungsten-CMP and results in superior removal of slurry particles and metallic residues introduced by the CMP processes. An optional spray cleaning step using a solution of HCl, $H_2O_2$ and $H_2O$ results in further reduction of metallic residue contamination following oxide-CMP. Compared to traditional brush cleaning the new spray cleaning process has a 2× improvement in throughput, less consumption of DI water, and low risk of cross-contamination between sequentially cleaned substrates.

42 Claims, 5 Drawing Sheets

PROCESS FOR CLEANING A SEMICONDUCTOR SUBSTRATE AFTER CHEMICAL-MECHANICAL POLISHING

BACKGROUND OF THE INVENTION (1) Field of the Invention

This invention relates to a method for cleaning a semiconductor substrate, and more specifically to a method for cleaning polishing slurry particles and metallic residues from the surface of a semiconductor substrate after chemical-mechanical polishing.

(2) Description of Related Art

In the fabrication of semiconductor integrated circuits CMP (Chemical-Mechanical Polishing) can be used to produce smooth topographies on surfaces deposited on the semiconductor substrates. Rough topography results when metal conductor lines are formed over a substrate containing device circuitry. The metal conductor lines serve to interconnect discrete devices, and thus form integrated circuits. The metal conductor lines are further insulated from the next interconnection level by thin layers of insulating material and holes formed through the insulating layers provide electrical access between successive conductive interconnection layers. In such wiring processes, it is desirable that the insulating layers have smooth surface topography, because it is difficult to lithographically image and pattern layers applied to rough surfaces. CMP can, also, be used to remove different layers of material from the surface of a semiconductor substrate. For example, following contact hole formation in an insulating layer, a metallization layer is blanket deposited and then CMP is used to produce planar metal contact studs embedded in the insulating material layer.

Briefly, the CMP processes involve holding and rotating a thin, flat substrate of the semiconductor material against a wetted polishing surface under controlled chemical, pressure and temperature conditions. A chemical slurry containing a polishing agent, such as alumina or silica, is used as the abrasive material. Additionally, the chemical slurry contains selected chemicals which etch various surfaces of the substrate during processing. The combination of mechanical and chemical removal of material during polishing results in superior planarization of the polished surface.

CMP of dielectric layers, such as silicon oxide, is widely accepted as the choice of planarization process for integrated circuit technologies having dense topographical features in multilevel metal interconnection structures. Additionally, CMP of blanket deposited tungsten layers is widely used for the formation of high-aspect-ratio interlevel connecting plugs.

An important challenge in CMP is to produce a clean substrate surface following polishing. Therefore, a primary concern with the use of CMP is the efficient and complete removal of the polishing slurry and other polishing residues and particulates following polishing in order to prevent introduction of defects into the polished product. Ideally, post-CMP cleaning should remove all polishing slurry, polishing residues and particulates in a quick and repeatable fashion without introducing additional defects or damage to the substrate surface. State-of-the art cleaning procedures following CMP typically use a water rinse and a scrub with a soft rotating brush to remove slurry residue from the surface of the semiconductor substrate. However, brush scrubbing can introduce scratches onto the substrate surface and is, also, a source of cross-contamination between sequentially processed substrates.

Post-CMP substrate cleaning is a subject of concern in current CMP technology, as shown in numerous patents. U.S. Pat. No. 5,704,987 entitled "Process For Removing Residue From A Semiconductor Wafer After Chemical-Mechanical Polishing" granted Jan. 6, 1998 to Cuc Kim Huynh et al describes a method for removing residual slurry particles from a semiconductor substrate surface following CMP (Chemical-Mechanical Planarization). The cleaning method uses a polishing pad and a surfactant, such as TMAH (tetramethylammonium hydroxide), in a first step followed by a second cleaning step which uses a polishing pad with water.

U.S. Pat. No. 5,078,801 entitled "Post-Polish Cleaning Of Oxidized Substrates By Reverse Colloidation" granted Jan. 7, 1992 to Farid A. Malik shows a process for removing residual silica particles from a post-polished silicon substrate. The process utilizes a KOH-based solution, followed by rinsing in de-ionized water, ultrasonic agitation in de-ionized water, and then drying the silicon substrate.

U.S. Pat. No. 5,632,667 entitled "No Coat Backside Wafer Grinding Process" granted May 27, 1994 to Michael R. Earl et al describes a method for grinding the backside surface of a semiconductor substrate, in which an organic acid cooling fluid, such as citric acid, is utilized during the grinding procedure to prevent particulates and residue from the substrate during the grinding from adhering to the metal bond pads of integrated circuits formed on the front side of the semiconductor substrate. The organic acid cooling fluid has a pH between about pH=3.5 and pH=5.5.

U.S. Pat. No. 5,597,443 entitled "Method And System For Chemical Mechanical Polishing Of Semiconductor Wafer" granted Jan. 28, 1997 to Eugene O. Hempel describes a post-CMP cleaning step using a $NH_4OH$ rinse.

U.S. Pat. No. 5,679,169 entitled "Method For Post Chemical-Mechanical Planarization Cleaning Of Semiconductor Wafers" granted Oct. 21, 1997 to David Gonzales et al shows a post-CMP cleaning method using a pre-clean step using a basic solution, followed by cleaning in an ammonia, TMAH, or citric acid rinse, and then dipping the substrate in a hydrogen fluoride solution.

The present invention is directed to a novel method of post-CMP cleaning of semiconductor substrates. The method of the present invention, which has been successfully applied to both post-oxide-CMP cleaning and post-tungsten-CMP cleaning, utilizes multi-chemical spray cleaning, requires less CMP processing time, has lower cost than conventional post-CMP cleaning methods and produces a polished surface having fewer particulate and residue defects.

SUMMARY OF THE INVENTION

It is a general object of the present invention to provide an improved method for removing residual slurry particles and metallic residues from the surface of a semiconductor substrate after chemical-mechanical polishing.

A more specific object of the present invention is to provide an improved method for removing residual slurry particles and metallic residues from the surface of a semiconductor substrate after chemical-mechanical polishing, said method being applicable to both oxide chemical-mechanical polishing and tungsten chemical-mechanical polishing.

Another object of the present invention is to provide an improved method for removing residual slurry particles and metallic residues from the surface of a semiconductor substrate after chemical-mechanical polishing, said method having superior results and lower cost than state-of-the-art brush cleaning processes.

And yet another object of the present invention is to provide an improved post-CMP cleaning method for removing residual slurry particles after either oxide CMP or tungsten CMP, said post-CMP cleaning method producing high process yield results for both oxide-CMP and tungsten-CMP products.

In accordance with the present invention, the above and other objectives are realized by using a method for removing residual slurry particles and metallic residues from the surface of a semiconductor substrate after chemical-mechanical polishing, the method comprising the steps of: loading the semiconductor substrate, after chemical-mechanical polishing, into a multi-chemical spray cleaning apparatus; spraying the semiconductor substrate with a solution of $NH_4OH$ and $H_2O$; spraying the semiconductor substrate with a solution of $NH_4OH$, $H_2O_2$ and $H_2O$; spraying the semiconductor substrate with a first de-ionized water rinse; spraying the semiconductor substrate with a dilute solution of HF and $H_2O$; spraying the semiconductor substrate with a second de-ionized water rinse; spraying the semiconductor substrate with a solution of HCl, $H_2O_2$ and $H_2O$; and spraying the semiconductor substrate with a third de-ionized water rinse.

In a second embodiment of the present invention, the above and other objectives are realized by using a method for chemical-mechanical polishing a tungsten layer deposited on a semiconductor substrate, including the method for removing residual slurry particles and metallic residues from the surface of the semiconductor substrate after chemical-mechanical polishing, the method comprising the steps of: providing the semiconductor substrate coated with a tungsten layer; chemical-mechanical polishing the tungsten layer using a $Fe(NO_3)_3$-based or $KIO_3$-based polishing slurry combined with alumina slurry particles; loading the semiconductor substrate, after chemical-mechanical polishing the tungsten layer, into a multi-chemical spray cleaning apparatus; spraying the polished semiconductor substrate with a solution of $NH_4OH$ and $H_2O$; spraying the polished semiconductor substrate with a solution of $NH_4OH$, $H_2O_2$ and $H_2O$; spraying the polished semiconductor substrate with a first de-ionized water rinse; spraying the polished semiconductor substrate with a dilute solution of HF and $H_2O$; and spraying the polished semiconductor substrate with a second de-ionized water rinse.

In a third embodiment of the present invention, the above and other objectives are realized by using a method for chemical-mechanical polishing a silicon oxide layer deposited on a semiconductor substrate, including the method for removing residual slurry particles and metallic residues from the surface of the silicon oxide layer after chemical-mechanical polishing, the method comprising the steps of: providing the semiconductor substrate coated with a silicon oxide layer; chemical-mechanical polishing the silicon oxide layer using a KOH-based polishing slurry combined with silica slurry particles; loading the semiconductor substrate, after chemical-mechanical polishing the silicon oxide layer, into a multi-chemical spray cleaning apparatus; spraying the polished semiconductor substrate with a solution of $NH_4OH$ and $H_2O$; spraying the polished semiconductor substrate with a solution of $NH_4OH$, $H_2O_2$ and $H_2O$; spraying the polished semiconductor substrate with a first de-ionized water rinse; spraying the polished semiconductor substrate with a dilute solution of HF and $H_2O$; spraying the polished semiconductor substrate with a second de-ionized water rinse; spraying the polished semiconductor substrate with a solution of HCl, $H_2O_2$ and $H_2O$; and spraying the polished semiconductor substrate with a third de-ionized water rinse.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method for removing residual slurry particles and metallic residues from the surface of a semiconductor substrate after chemical-mechanical polishing will now be described in detail.

Figure 1:
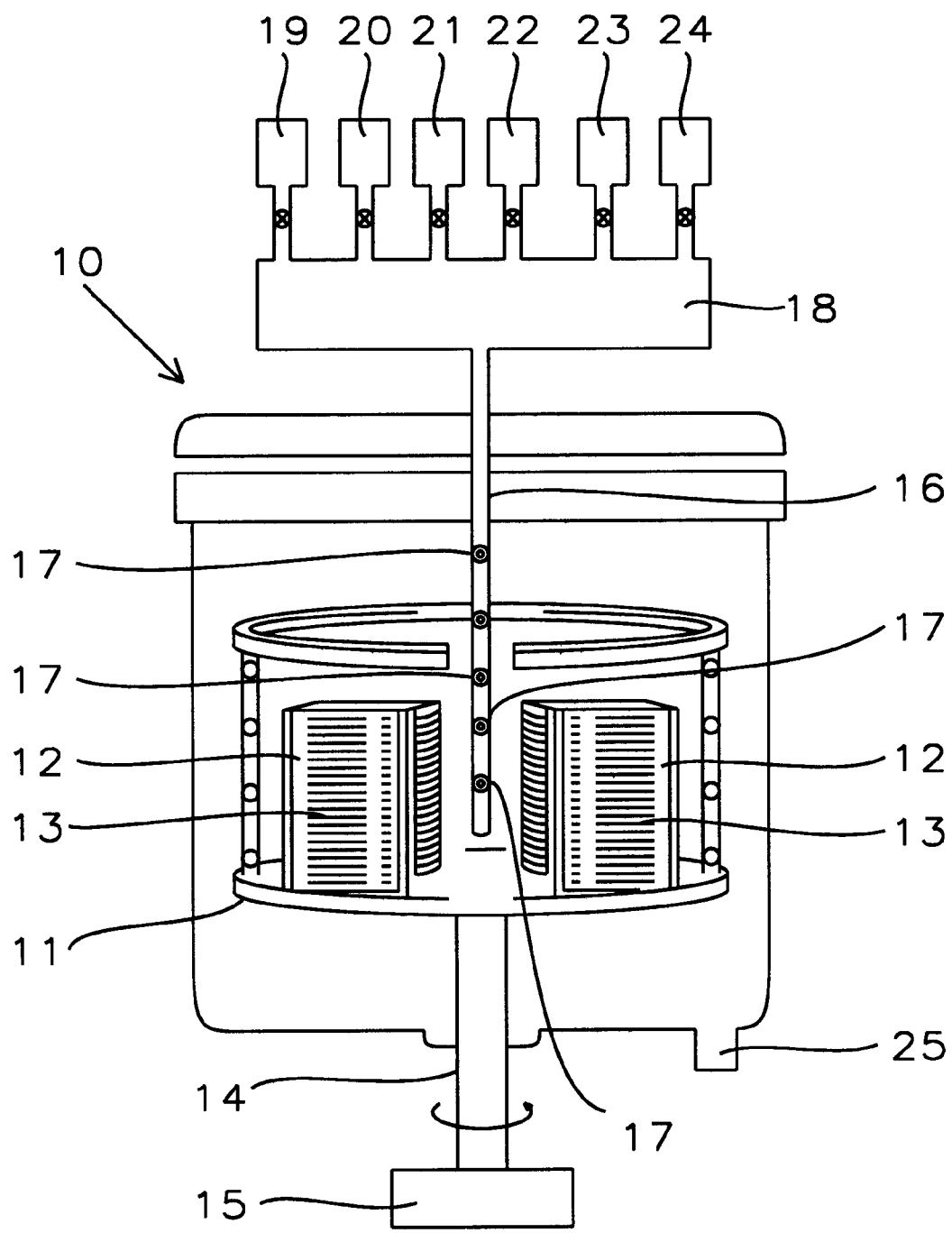
FIG. 1 is a schematic drawing of the spray cleaning apparatus used for the post-CMP cleaning method of the present invention.

The cleaning process is carried out in a conventional spray cleaning apparatus, as shown schematically in FIG. 1. The spray cleaning process chamber 10 contains a multi-position turntable 11, onto which are mounted semiconductor substrate cassettes 12 holding semiconductor substrates 13. The multi-position turntable 11 is attached to a motor shaft 14 and motor 15 which serve to rotate the multi-position turntable during the semiconductor substrate cleaning process. A stationary spray post 16 is located on the axis of rotation of the multi-position turntable. The stationary spray post 16 has a plurality of orifices 17 which spray the cleaning solution onto the semiconductor substrates. Attached to the spray post 16 is a liquid feed system which comprises a reagent mixing manifold 18, multiple chemical reservoirs 19–22, de-ionized water reservoir 23 and nitrogen gas reservoir 24. Also, the liquid feed system includes means to filter reagents, means to pressurize the liquid supply, and means to heat the cleaning solutions before introduction into the spray post 16. After CMP, semiconductor substrates 13 are loaded into cassettes 12 and the cassettes 12 are mounted on the turntable 11 that rotates the substrates past the stationary spray post 16. Cleaning solutions, in the form of sprays, are directed through the spray post 16 and onto the semiconductor substrates 13. Rotation of the turntable holding the cassettes containing the semiconductor substrates further insures uniform distribution of the cleaning solutions upon the substrates during the cleaning process. The cleaning solutions are drained continuously through the bottom of the chamber 10 by aspirator drain 25 so that fresh chemicals always contact the substrates. This procedure eliminates cleaning solution contamination and cross-contamination problems associated with immersion cleaning processes. The spray cleaning apparatus performs the entire cleaning sequence, including sequential application of multiple cleaning solutions, multiple rinses, and the final spin-drying step without removing the substrates from the apparatus.

The main challenge for post-CMP cleaning is to successfully and efficiently remove polishing slurry residue and other polishing residues and particulates following CMP in order to prevent introduction of defects into the polished product. Ideally, post-CMP cleaning should remove all polishing slurry, polishing residues and particulates in a quick and repeatable fashion without introducing additional defects or damage to the substrate surface. Further, there is a significant difference between the challenge of post-oxide-CMP cleaning and post-tungsten-CMP cleaning. In the case of tungsten-CMP, the low pH alumina-slurry used to polish tungsten is more difficult to be removed by brush scrubbing. In addition to removing the slurry residue the cleaning process for post-tungsten-CMP should remove trace metallic residues left on or embedded in the substrate surface during tungsten-CMP. The source of the metallic residues is believed to be the slurries used for CMP of tungsten layers. Most commercially available tungsten-CMP slurries use oxidants containing heavy metal components, e.g. $Fe(NO_3)_3$ or $KIO_3$.

In order to access the effectiveness of various post-CMP cleaning processes for both oxide-CMP and tungsten-CMP, the cleaning processes were tested on: (1) Semiconductor substrates coated with a blanket oxide layer; (2) Semiconductor substrates coated with a blanket tungsten layer on top of an oxide layer; and (3) Semiconductor substrates containing arrays of tungsten features embedded in an oxide layer. Oxide-CMP was performed using a KOH-based slurry containing silica abrasive. Tungsten-CMP was performed using either a $Fe(NO_3)_3$-based slurry containing alumina abrasive or a $KIO_3$-based slurry containing alumina abrasive. The effectiveness of various multi-step chemical spray cleaning processes was ascertained as well as the effectiveness of state-of-the-art brush cleaning. Cleaning process performance was evaluated by measuring the number of particle defects on the substrate after performing the cleaning process and measuring by TXRF (transmission X-ray fluorescence) the metal contamination on the substrate after performing the cleaning process. In addition, the etching effect of the cleaning process chemicals on oxide and tungsten was measured and the contribution to surface roughness by the cleaning process was, also, ascertained.

Figure 2:
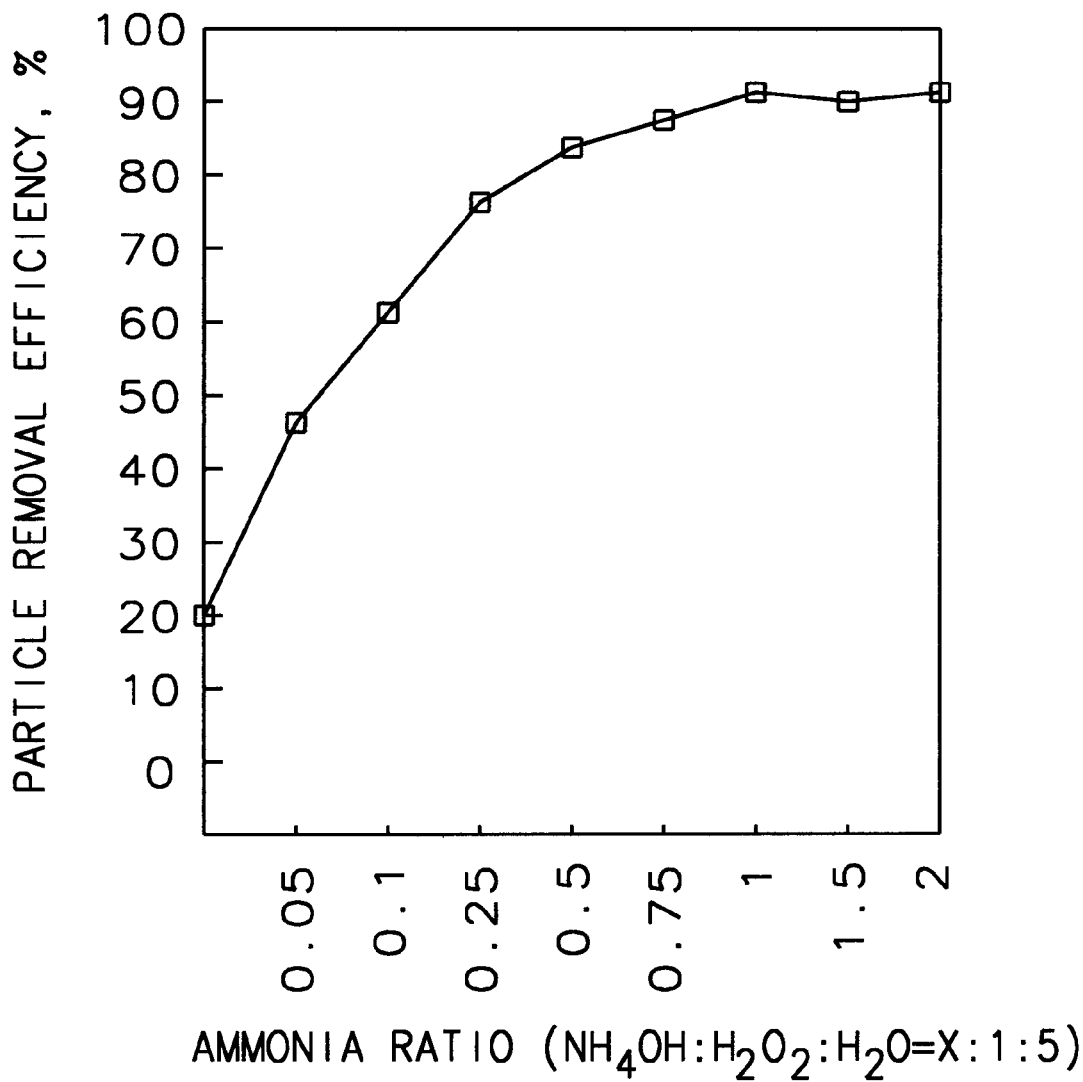
FIG. 2 is a graph of particle removal efficiency versus ammonia ratio in a mixture of $NH_4OH$, $H_2O_2$ and $H_2O$.

The results of these studies will now be presented. A mixture of $NH_4OH$, $H_2O_2$ and $H_2O$ is the preferred solution for post-CMP cleaning. This mixture is commonly called ammonia/-peroxide mix (APM). In order to improve the particle removal efficiency of APM, the $NH_4OH$ mixing ratio in APM was evaluated. FIG. 2 shows the efficiency of particle removal for different $NH_4OH$ mixing ratios. The results in FIG. 2 show that the particle removal efficiency is very sensitive to the $NH_4OH$ content of the cleaning solution. The ratio X of $NH_4OH$ in a $NH_4OH:H_2O_2:H_2O$ solution should be X≥1 for solutions having ratios X:1:5. If X<1, the particle removal efficiency falls dramatically from approximately 90% to 20%.

Further improvement to particle removal efficiency for APM having the ratio 1:1:5 for $NH_4OH:H_2O_2:H_2O$ is obtained by adding pressure to the injected liquid and/or adding a pre-wet step using a mixture of $NH_4OH$ and $H_2O$ in the ratio 1:5 or a mixture of $H_2O_2$ and $H_2O$ in the ratio 1:5. The pre-wet step is for a time between about 5 and 20 sec. and preferably for a time of 10 sec. And the pre-wet solution is applied at a temperature between about 30 and 70° C., and preferably at about 50° C. The liquid injection pressure should be between about 5 and 10 psi. These results are shown in Table 1.

TABLE 1

PARTICLE REMOVAL EFFECTIVENESS
FOR MODIFIED CLEANING RECIPES

| CLEANING RECIPE MODIFICATION | PARTICLE REMOVAL |
|---|---|
| Ammonia/Peroxide Mix (APM) | 92% |
| APM + Liquid Injection Pressure (LIP) | 94% |
| 5 sec. pre-wet + APM | 95% |
| 5 sec. pre-wet + APM + LIP | 97% |

The combined effect of cleaning solutions containing ammonia/peroxide mix (APM), dilute HF and hydrochloric/-peroxide mix (HPM) was, also, evaluated. The temperature of the ammonia/peroxide mix (APM) solution was between about 75 and 80° C. The temperature of the dilute HF solution was about 25° C. The temperature of the hydrochloric/peroxide mix (HPM) was between about 75 and 80° C. In order to minimize possible surface roughness due to HF etching different application times for the HF step were evaluated. Table 2 lists the results for different combined cleaning recipes applied to post-oxide-CMP.

TABLE 2

| CLEANING RECIPE | DEFECTS >0.2 μm | OXIDE LOSS Å | ROUGHNESS Å | Metal Atom Conc. on Surface | | | | | |
|---|---|---|---|---|---|---|---|---|---|
| | | | | K | Na | Al | Ca | Fe | Cu |
| APM + 5 sec. HF | 39 | 15 | 3.14 | 12.33 | 14.72 | 10.71 | 3.84 | 2.04 | 1.07 |
| APM + 15 sec. HF | 21 | 42 | 3.43 | 4.84 | 11.21 | <4.3 | 3.38 | 1.14 | 1.08 |
| APM + 30 sec. HF | 19 | 85 | 4.85 | 4.71 | 10.08 | <4.3 | 3.24 | 1.13 | 0.98 |
| 15 sec. HF + APM | 124 | 40 | 3.52 | 18.81 | 16.79 | 15.25 | 5.29 | 1.64 | 1.19 |
| APM + 15 sec. HF + HPM | 19 | 43 | 3.38 | 3.38 | <10 | <4.3 | <1.8 | 0.62 | 0.92 |
| APM + 15 sec. HF + APM + HPM | 11 | 45 | 3.47 | 3.22 | <10 | <4.3 | <1.8 | <0.5 | 1.01 |
| Standard Brush Scrubber | 24 | 3 | 2.92 | 26.44 | 18.72 | 14.78 | 6.58 | 2.18 | 1.14 |
| Control Substrate No CMP or Clean | 10 | 0 | 2.84 | <2.6 | <10 | <4.3 | 3.03 | 1.25 | 0.95 |

Metal Atom conc. measured by TXRF (transmission X-ray fluorescence) (x E10 atoms/cm$^2$)

According to the results shown in Table 2, the combined cleaning recipes utilizing APM, dilute HF and HPM exhibit much lower levels of metallic residues after application of the cleaning recipe than the level of metallic residue when utilizing brush scrubbing as the post-CMP cleaning process. A cleaning recipe using APM, dilute HF and HPM results in a post-CMP "clean" substrate surface having comparable levels of defects and metallic residues as the control substrate which was not subjected to CMP for post-CMP cleaning operations. Also, note that cleaning in HF for 15 sec. is sufficient for defect and metallic contamination removal; however, applying HF for 30 sec. results in greater oxide layer etching and degraded surface roughness. Therefore, in the cleaning process, application of dilute HF for times greater than 20 sec. is not recommended. Of primary importance is the sequence of steps in the cleaning recipe. When dilute HF is applied prior to the APM the particle defect level and the concentrations of metallic residues are significantly higher than when APM is applied prior the dilute HF.

Tungsten-CMP presents a different substrate and different conditions for the post-tungsten-CMP cleaning process. The post-CMP substrate surface consists primarily of planar oxide having a small area percentage of tungsten features. The tungsten features are typically slightly recessed below the oxide surface, and are usually dished in a concave fashion rather than planar. Also, after tungsten CMP residual abrasive particles of alumina have different adhesion coefficients to oxide and tungsten. Table 4 shows

TABLE 4

| CLEANING RECIPE | OXIDE LOSS | W LOSS | DEFECTS |
|---|---|---|---|
| APM + 20 sec. HF | 43 Å | 62 Å | 24 |
| APM + 60 sec. HF | 108 Å | 224 Å | 39 |
| 20 sec. HF + APM | 41 Å | 58 Å | 286 |
| Brush Scrubbing | <5 Å | <5 Å | 891 | the defect levels and oxide and tungsten layer losses after application of various cleaning recipes. Clearly brush scrubbing is inadequate for post-tungsten-CMP cleaning. Spray cleaning with APM and HF reduces defects, but again the sequence of the steps in the cleaning recipe is important. When HF is applied prior to the APM the particle defect level is significantly higher than when APM is applied prior the dilute HF. However, consideration must, also, be given to the effect of the dilute HF on the etching of oxide and tungsten and consequential further recessing of the embedded tungsten features. A cleaning process utilizing APM+20 sec. HF results in 43 Å oxide loss and 62 Å tungsten loss, thereby further recessing the tungsten features by about 20 Å. On the other hand, a cleaning process utilizing APM+60 sec. HF results in 108 Å oxide loss and 224 Å tungsten loss, and causes further recessing of the tungsten features by about 115 Å. Since this amount (115 Å) of further recessing of the tungsten features would be detrimental to the device structure, it is clear that the use of dilute HF in post-tungsten-CMP cleaning must be properly controlled and therefore in an APM+HF cleaning recipe the exposure to dilute HF should be limited to 20 sec.

The effectiveness of a post-tungsten-CMP cleaning process utilizing APM+20 sec. HF for removal of metallic residues was, also, studied and these results are shown in Table 5.

TABLE 5

| CLEANING | | Metal Atom Conc. on Surface | | | | | |
|---|---|---|---|---|---|---|---|
| RECIPE | SLURRY | K | Na | Al | Ca | Fe | Cu |
| APM + 20 sec. HF | $KIO_3$-based | 22.7 | 14.5 | 58.3 | 10.7 | 1.54 | 1.89 |

TABLE 5-continued

| CLEANING | | Metal Atom Conc. on Surface | | | | | |
|---|---|---|---|---|---|---|---|
| RECIPE | SLURRY | K | Na | Al | Ca | Fe | Cu |
| Brush Scrubbing | $KIO_3$-based | 156 | 63.8 | 1418 | 562 | 28 | 13 |
| APM + 20 sec. HF | $Fe(NO_3)_3$-based | 14.8 | 11.52 | 87.2 | 16.5 | 5.4 | 1.57 |
| Brush Scrubbing | $Fe(NO_3)_3$-based | 28.3 | 88.4 | 2400 | 221 | 865 | 19 |

Metal ion conc. neasured by TXRF (transmission X-ray fluorescence) (× E10 atoms/cm$^2$)

The APM+20 sec. HF cleaning process shows excellent clean-up of metallic residues for both tungsten-CMP using a $KIO_3$-based polishing slurry and tungsten-CMP using a $Fe(NO_3)_3$-based slurry. Use of brush scrubbing as the post-tungsten-CMP cleaning process is not adequate for tungsten-CMP, as shown by the high levels of metallic residues remaining on the substrates following post-tungsten-CMP brush cleaning.

Based on these experimental results the preferred sequence of spray cleaning steps is listed in Table 6. Step 1 is a presoak in $NH_4OH+H_2O$ or $H_2O_2+H_2O$. Step 2 is spray cleaning in a solution of $NH_4OH$, $H_2O_2$ and $H_2O$. Step 3 is a spray rinse in DI-water. Step 4 is spray cleaning in a dilute solution of HF and $H_2O$. Step 5 is a spray rinse in DI-water. Step 6 (Optional) is spray cleaning in a solution of HCl, $H_2O_2$ and $H_2O$. Step 7 is a final spray rinse in DI-water.

TABLE 6

| STEP | CLEANING RECIPE | SOLUTION | TEMP. | TIME |
|---|---|---|---|---|
| 1 | Pre-soak | $NH_4OH$ (or $H_2O_2$) + $H_2O$ 1:5 | 50° C. | 10 sec. |
| 2 | Ammonia/Peroxide Mix (APM) | $NH_4OH$ + $H_2O_2$ + $H_2O$ 1:1:5 | 75–80° C. | 10 min. |
| 3 | Ramp Rinsing | DI water | 25° C. | 5 min. |
| 4 | Dilute HF | HF + $H_2O$ 1:50 | 25° C. | 10–20 sec. |
| 5 | Ramp Rinsing | DI water | 25° C. | 5 min. |
| 6 | Hydrochloric/Peroxide Mix (HPM) | HCl + $H_2O_2$ + $H_2O$ 1:1:6 | 75–80° C. | 10 min. |
| 7 | Ramp Rinsing | DI water | 25° C. | 5 min. |

The above post-CMP spray cleaning sequence is effective for post-CMP cleaning for both oxide-CMP and tungsten-CMP and results in fewer defects from residual polishing slurry particles and lower contamination levels from metallic residues than achievable with conventional brush cleaning. Compared to traditional brush cleaning the new spray cleaning process has a 2× improvement in throughput, less consumption of DI water, and low risk of cross-contamination between sequentially cleaned substrates.

Figure 3:
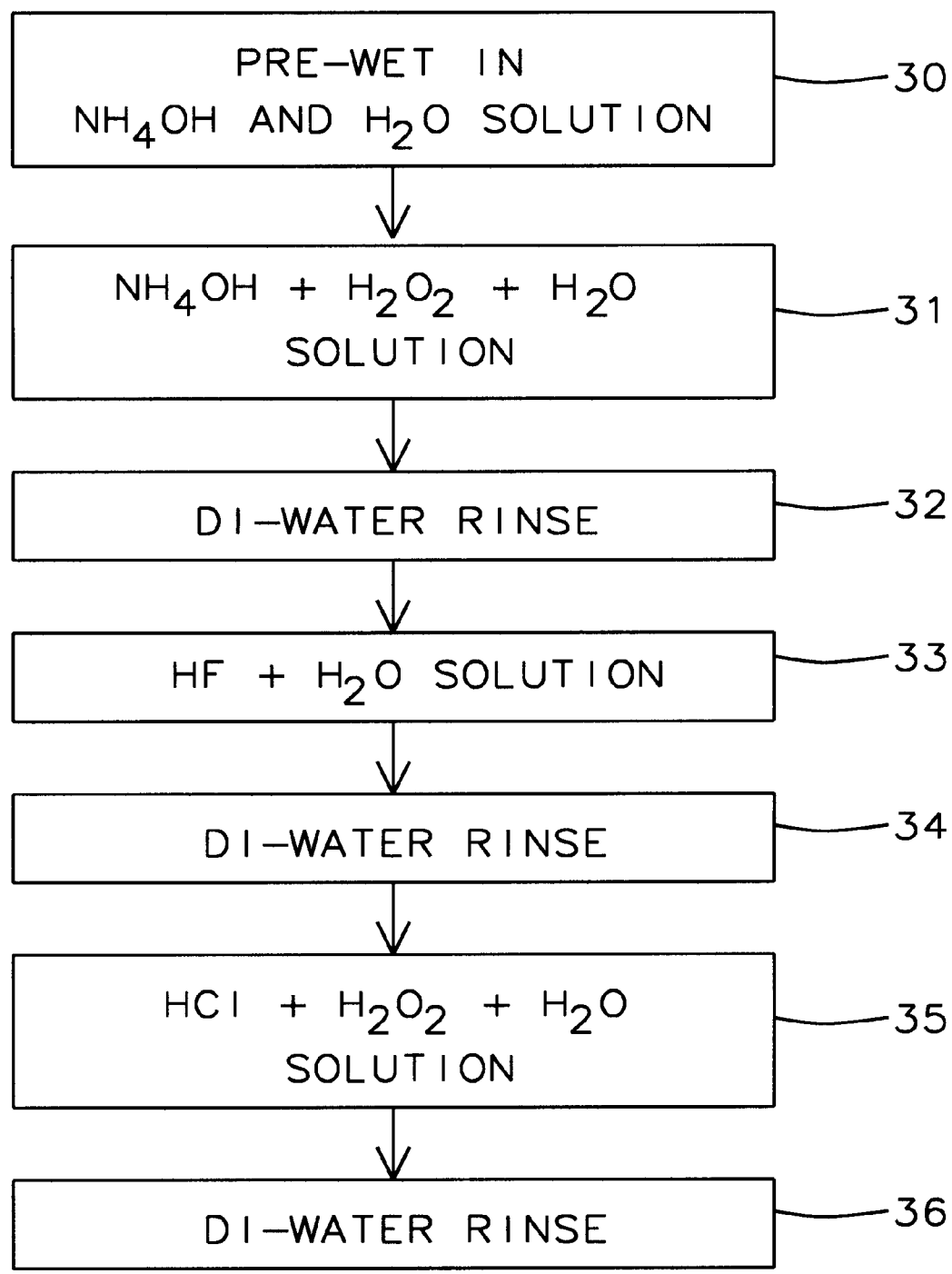
FIG. 3 is a flow chart of the method of the preferred embodiment of the present invention.

Referring to FIG. 3, which is a flow chart for the preferred post-CMP cleaning process, the cleaning method involves a pre-wet in a solution of $NH_4OH+H_2O$, shown as 30. This is followed by spray cleaning in a solution of $NH_4OH$, $H_2O_2$ and $H_2O$, shown as 31. After a spray rinse 32 in DI-water a spray solution of HF and $H_2O$ is applied, shown 33, followed by a second spray rinse 34 in DI-water. Spray cleaning in a solution of $HCl+H_2O_2+H_2O$, shown as 35 is an optional step. A final spray rinse 36 in DI-water completes the cleaning process.

Figure 4:
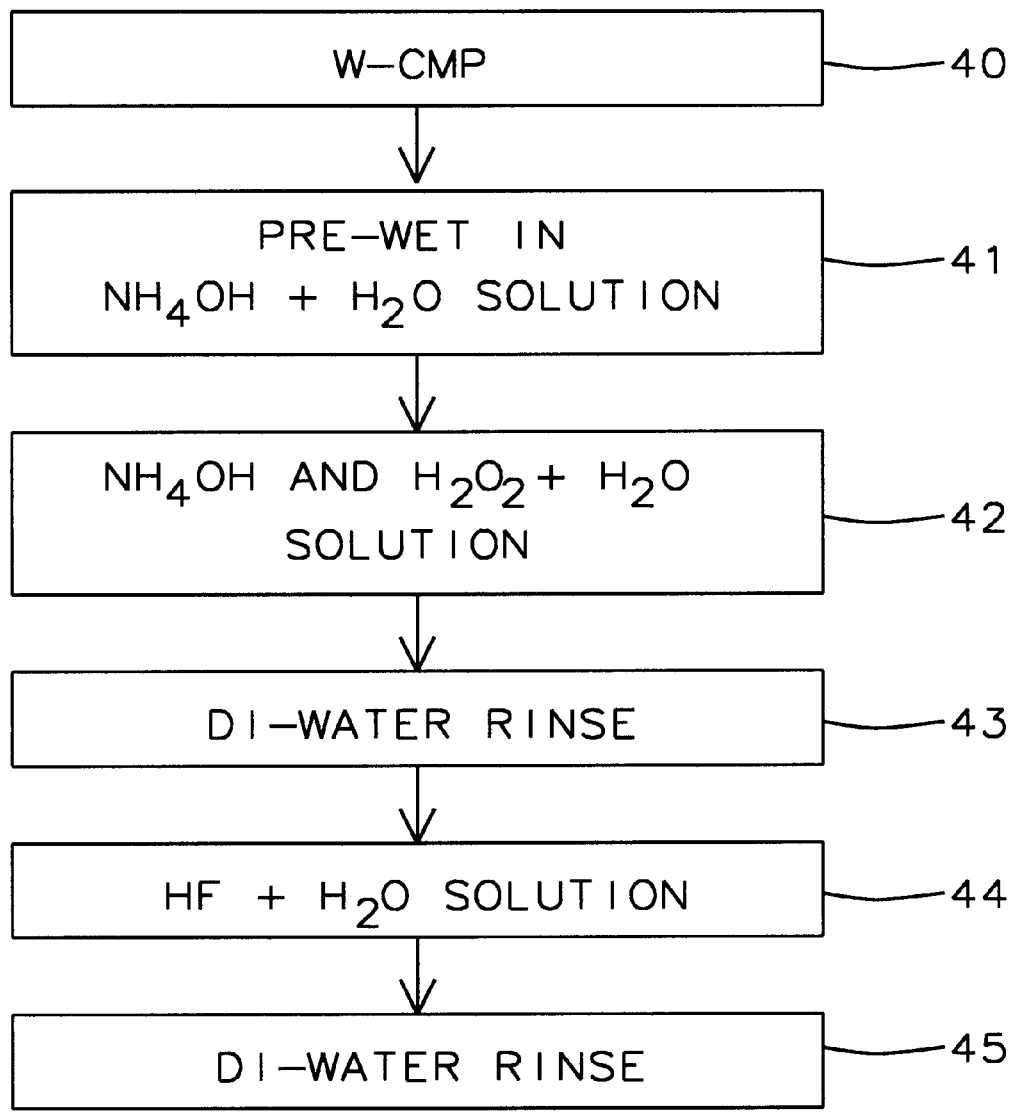
FIG. 4 is a flow chart of the method of a second embodiment of the present invention.

FIG. 4 is a flow chart of the embodiment of the post-CMP cleaning process as applied to W-CMP. After CMP of a tungsten layer, shown as 40, the first spray cleaning step is a pre-wet in a solution of $NH_4OH+H_2O$, shown as 41. This is followed by spray cleaning in a solution of $NH_4OH$, $H_2O_2$ and $H_2O$, shown as 42. After a spray rinse 43 in DI-water a spray solution of HF and $H_2O$ is applied, shown as 44, followed by a second spray rinse 45 in DI-water.

Figure 5:
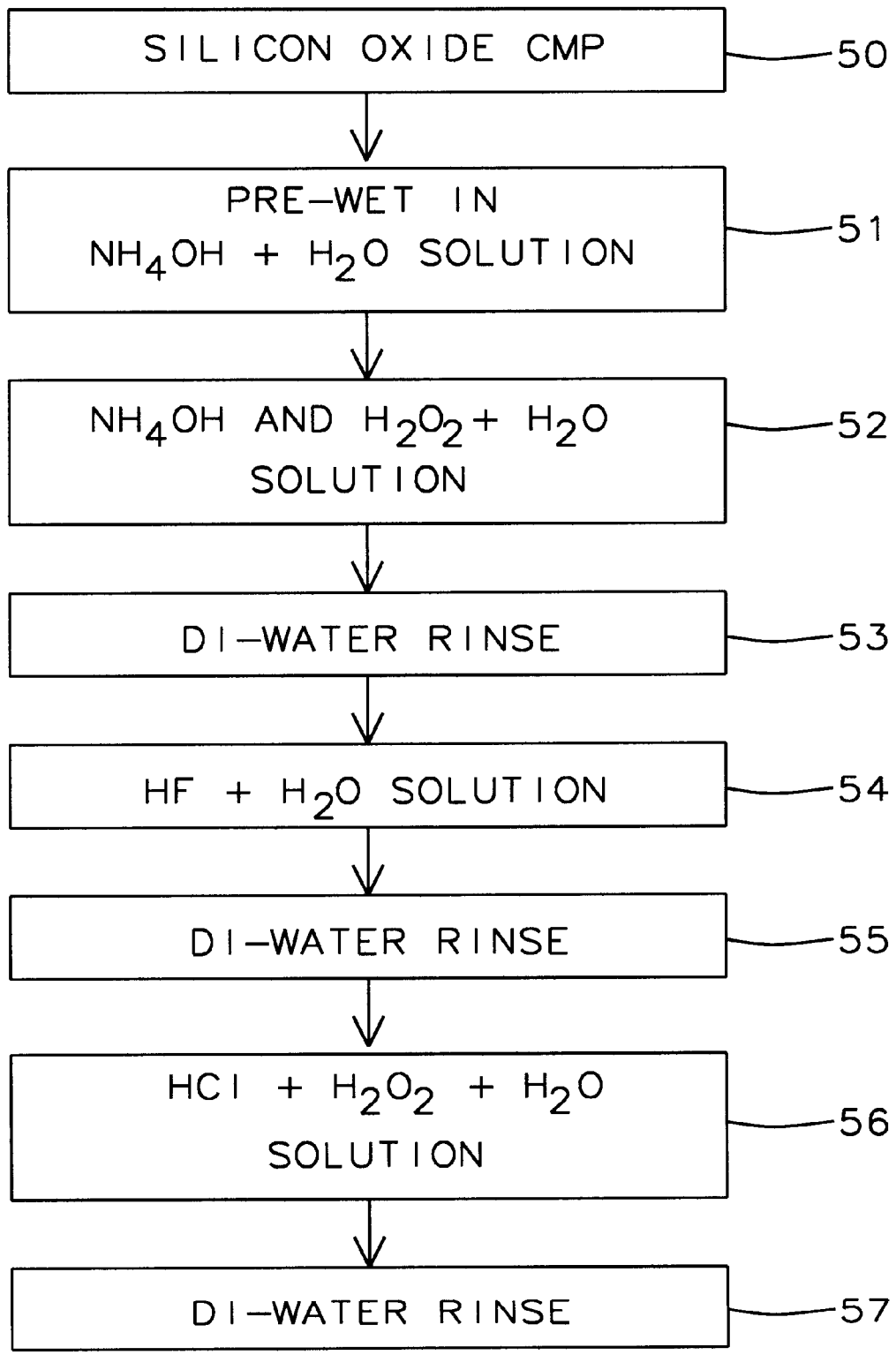
FIG. 5 is a flow chart of the method of a third embodiment of the present invention.

FIG. 5 is a flow chart of the embodiment of the post-CMP cleaning process as applied to oxide-CMP. After CMP of an oxide layer, shown as 50, the first spray cleaning step is a pre-wet in a solution of $NH_4OH+H_2O$, shown as 51. This is followed by spray cleaning in a solution of $NH_4OH$, $H_2O_2$ and $H_2O$, shown as 52. After a spray rinse 53 in DI-water a spray solution of HF and $H_2O$ is applied, shown as 54, followed by a second spray rinse 55 in DI-water. Spray cleaning in a solution of $HCl+H_2O_2+H_2O$, shown as 56 is an optional step. A final spray rinse 57 in DI-water completes the cleaning process.

While the invention has been particularly shown and described with reference to the preferred embodiments thereof, it will be understood by those skilled in the art that various changes in form and details may be made without departing from the spirit and scope of the invention.

What is claimed is:

1. A method for removing residual slurry particles and metallic residues from the surface of a semiconductor substrate after chemical-mechanical polishing, the method comprising the steps of:

loading said semiconductor substrate, after chemical-mechanical polishing, into a multi-chemical spray cleaning apparatus;

spraying the semiconductor substrate with a solution comprising $NH_4OH$ and $H_2O$;

spraying the semiconductor substrate with a solution comprising $NH_4OH$, $H_2O_2$ and $H_2O$;

spraying the semiconductor substrate with a first de-ionized water rinse;

spraying the semiconductor substrate with a dilute solution of HF and $H_2O$;

spraying the semiconductor substrate with a second de-ionized water rinse;

spraying the semiconductor substrate with a solution comprising HCl, $H_2O_2$ and $H_2O$; and spraying the semiconductor substrate with a third de-ionized water rinse.

2. The method of claim 1, wherein said solution comprising $NH_4OH$ and $H_2O$, has a concentration of between about 1 and 3 parts $NH_4OH$ to 5 parts $H_2O$.

3. The method of claim 1, wherein said solution comprising $NH_4OH$ and $H_2O$, has temperature between about 30 and 70° C.

4. The method of claim 1, wherein said solution comprising $NH_4OH$ and $H_2O$, is sprayed onto the semiconductor substrate for a time between about 5 and 20 sec.

5. The method of claim 1, wherein said solution comprising $NH_4OH$, $H_2O_2$ and $H_2O$, has a concentration of between about 0.5 and 2 parts $NH_4OH$ to 5 parts $H_2O$ and between about 0.5 and 2 parts $H_2O_2$ to 5 parts $H_2O$.

6. The method of claim 1, wherein said solution comprising $NH_4OH$, $H_2O_2$ and $H_2O$, has a temperature between about 75 and 80° C.

7. The method of claim 1, wherein said solution comprising $NH_4OH$, $H_2O_2$ and $H_2O$, is sprayed onto the semiconductor substrate for a time between about 5 and 20 min.

8. The method of claim 1, wherein said first, second and third de-ionized water rinses have a temperature between about 20 and 30° C.

9. The method of claim 1, wherein said first, second and third de-ionized water rinses are each sprayed onto the semiconductor substrate for a time between about 3 and 10 min.

10. The method of claim 1, wherein said dilute solution of HF and $H_2O$, has a concentration of between about 0.5 and 2 parts HF to 50 parts $H_2O$.

11. The method of claim 1, wherein said dilute solution of HF and $H_2O$, has a temperature between about 20 and 30° C.

12. The method of claim 1, wherein said dilute solution of HF and $H_2O$, is sprayed onto the semiconductor substrate for a time between about 10 and 20 sec.

13. The method of claim 1, wherein said solution comprising HCl, $H_2O_2$ and $H_2O$, has a concentration of between about 0.5 and 2 parts HCl to 6 parts $H_2O$ and between about 0.5 and 2 parts $H_2O_2$ to 6 parts $H_2O$.

14. The method of claim 1, wherein said solution comprising HCl, $H_2O_2$ and $H_2O$, has a temperature between about 75 and 80° C.

15. The method of claim 1, wherein said solution comprising HCl, $H_2O_2$ and $H_2O$, is sprayed onto the semiconductor substrate for a time between about 5 and 20 min.

16. A method for chemical-mechanical polishing a tungsten layer deposited on a semiconductor substrate, including the method for removing residual slurry particles and metallic residues from the surface of the semiconductor substrate after chemical-mechanical polishing, the method comprising the steps of:

providing the semiconductor substrate coated with a tungsten layer;

chemical-mechanical polishing said tungsten layer using a $Fe(NO_3)_3$-based or $KIO_3$-based polishing slurry combined with alumina slurry particles;

loading said semiconductor substrate, after chemical-mechanical polishing said tungsten layer using a $Fe(NO_3)_3$-based or $KIO_3$-based polishing slurry combined with alumina slurry particles, into a multi-chemical spray cleaning apparatus;

spraying the polished semiconductor substrate with a solution comprising $NH_4OH$ and $H_2O$;

spraying the polished semiconductor substrate with a solution comprising $NH_4OH$, $H_2O_2$ and $H_2O$;

spraying the polished semiconductor substrate with a first de-ionized water rinse;

spraying the polished semiconductor substrate with a dilute solution of HF and $H_2O$; and spraying the polished semiconductor substrate with a second de-ionized water rinse.

17. The method of claim 16 wherein, said solution comprising $NH_4OH$ and $H_2O$, has a concentration of between about 1 and 3 parts $NH_4OH$ to 5 parts $H_2O$.

18. The method of claim 16, wherein said solution comprising $NH_4OH$ and $H_2O$, has temperature between about 30 and 70° C.

19. The method of claim 16, wherein said solution comprising $NH_4OH$ and $H_2O$, is sprayed onto the polished semiconductor substrate for a time between about 5 and 20 sec.

20. The method of claim 16, wherein said solution comprising $NH_4OH$, $H_2O_2$ and $H_2O$, has a concentration of between about 0.5 and 2 parts $NH_4OH$ to 5 parts $H_2O$ and between about 0.5 and 2 parts $H_2O_2$ to 5 parts $H_2O$.

21. The method of claim 16, wherein said solution comprising $NH_4OH$, $H_2O_2$ and $H_2O$, has a temperature between about 75 and 80° C.

22. The method of claim 16, wherein said solution comprising $NH_4OH$, $H_2O_2$ and $H_2O$, is sprayed onto the polished semiconductor substrate for a time between about 5 and 20 min.

23. The method of claim 16, wherein said first and second de-ionized water rinses have a temperature between about 20 and 30° C.

24. The method of claim 16, wherein said first and second de-ionized water rinses are each sprayed onto the polished semiconductor substrate for a time between about 3 and 10 min.

25. The method of claim 16, wherein said dilute solution of HF and $H_2O$, has a concentration of between about 0.5 and 2 parts HF to 50 parts $H_2O$.

26. The method of claim 16, wherein said dilute solution of HF and $H_2O$, has a temperature between about 20 and 30° C.

27. The method of claim 16, wherein said dilute solution of HF and $H_2O$, is sprayed onto the polished semiconductor substrate for a time between about 10 and 20 sec.

28. A method for chemical-mechanical polishing a silicon oxide layer deposited on a semiconductor substrate, including the method for removing residual slurry particles and metallic residues from the surface of the silicon oxide layer after chemical-mechanical polishing, the method comprising the steps of:

providing the semiconductor substrate coated with a silicon oxide layer;

chemical-mechanical polishing said silicon oxide layer using a KOH-based polishing slurry combined with silica slurry particles;

loading said semiconductor substrate, after chemical-mechanical polishing said silicon oxide layer using a KOH-based polishing slurry combined with silica slurry particles, into a multi-chemical spray cleaning apparatus;

spraying the polished semiconductor substrate with a solution comprising $NH_4OH$ and $H_2O$;

spraying the polished semiconductor substrate with a solution comprising $NH_4OH$, $H_2O_2$ and $H_2O$;

spraying the polished semiconductor substrate with a first de-ionized water rinse;

spraying the polished semiconductor substrate with a dilute solution of HF and $H_2O$;

spraying the polished semiconductor substrate with a second de-ionized water rinse;

spraying the polished semiconductor substrate with a solution comprising HCl, $H_2O_2$ and $H_2O$; and spraying the polished semiconductor substrate with a third de-ionized water rinse.

29. The method of claim 28, wherein said solution comprising $NH_4OH$ and $H_2O$, has a concentration of between about 1 and 3 parts $NH_4OH$ to 5 parts $H_2O$.

30. The method of claim 28, wherein said solution comprising $NH_4OH$ and $H_2O$, has temperature between about 30 and 70° C.

31. The method of claim 28, wherein said solution comprising $NH_4OH$ and $H_2O$, is sprayed onto the polished semiconductor substrate for a time between about 5 and 20 sec.

32. The method of claim 28, wherein said solution comprising $NH_4OH$, $H_2O_2$ and $H_2O$, has a concentration of between about 0.5 and 2 parts $NH_4OH$ to 5 parts $H_2O$ and between about 0.5 and 2 parts $H_2O_2$ to 5 parts $H_2O$.

33. The method of claim 28, wherein said solution comprising $NH_4OH$, $H_2O_2$ and $H_2O$, has a temperature between about 75 and 80° C.

34. The method of claim 28, wherein said solution comprising $NH_4OH$, $H_2O_2$ and $H_2O$, is sprayed onto the polished semiconductor substrate for a time between about 5 and 20 min.

35. The method of claim 28, wherein said first, second and third de-ionized water rinses have a temperature between about 20 and 30° C.

36. The method of claim 28, wherein said first, second and third de-ionized water rinses are each sprayed onto the semiconductor substrate for a time between about 3 and 10 min.

37. The method of claim 28, wherein said dilute solution of HF and $H_2O$, has a concentration of between about 0.5 and 2 parts HF to 50 parts $H_2O$.

38. The method of claim 28, wherein said dilute solution of HF and $H_2O$, has a temperature between about 20 and 30° C.

39. The method of claim 28, wherein said dilute solution of HF and $H_2O$, is sprayed onto the polished semiconductor substrate for a time between about 10 and 20 sec.

40. The method of claim 28, wherein said solution comprising HCl, $H_2O_2$ and $H_2O$, has a concentration of between about 0.5 and 2 parts HCl to 6 parts $H_2O$ and between about 0.5 and 2 parts $H_2O_2$ to 6 parts $H_2O$.

41. The method of claim 28, wherein said solution comprising HCl, $H_2O_2$ and $H_2O$, has a temperature between about 75 and 80° C.

42. The method of claim 28, wherein said solution comprising HCl, $H_2O_2$ and $H_2O$, is sprayed onto the polished semiconductor substrate for a time between about 5 and 20 min.

* * * * *